(12) United States Patent
Kim (10) Patent No.: US 7,893,448 B2
(45) Date of Patent: Feb. 22, 2011

(54) LIGHT EMITTING DEVICE HAVING NANO STRUCTURES FOR LIGHT EXTRACTION

(75) Inventor: Jong wook Kim, Seongnam-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 650 days.

(21) Appl. No.: 11/437,809

(22) Filed: May 22, 2006

(65) Prior Publication Data
US 2006/0270074 A1 Nov. 30, 2006

(30) Foreign Application Priority Data
May 24, 2005 (KR) ...................... 10-2005-0043596

(51) Int. Cl.
*H01L 33/58* (2010.01)
(52) U.S. Cl. .................. 257/95; 257/E33.046
(58) Field of Classification Search .................. 257/95, 257/E33.046; H01L 33/58
See application file for complete search history.

(56) References Cited

U.S. PATENT DOCUMENTS

| | | | |
|---|---|---|---|
| 6,495,862 B1* | 12/2002 | Okazaki et al. | 257/103 |
| 6,657,236 B1* | 12/2003 | Thibeault et al. | 257/98 |
| 2002/0123227 A1* | 9/2002 | Winningham et al. | 438/700 |
| 2004/0119085 A1* | 6/2004 | Bader et al. | 257/98 |
| 2004/0157358 A1* | 8/2004 | Hiramatsu et al. | 438/93 |
| 2004/0206969 A1* | 10/2004 | Orita | 257/97 |
| 2005/0199895 A1* | 9/2005 | Seong et al. | 257/94 |
| 2006/0024018 A1* | 2/2006 | Piehl et al. | 385/147 |
| 2006/0286697 A1* | 12/2006 | Leem | 438/27 |
| 2007/0166862 A1* | 7/2007 | Kim et al. | 438/42 |
| 2007/0267644 A1* | 11/2007 | Leem | 257/98 |
| 2009/0050909 A1* | 2/2009 | Chen et al. | 257/88 |

FOREIGN PATENT DOCUMENTS

| | | |
|---|---|---|
| DE | 10244986 | 4/2004 |
| EP | 1422748 | 5/2004 |
| JP | 2004 128445 | 4/2004 |
| JP | 2005228936 A * | 8/2005 |
| JP | 2006261666 A * | 9/2006 |

* cited by examiner

*Primary Examiner*—Leonardo Andújar
*Assistant Examiner*—Christopher M Roland
(74) *Attorney, Agent, or Firm*—McKenna Long & Aldridge LLP

(57) ABSTRACT

The present invention relates to a light emitting device having nano structures for light extraction and a method for manufacturing the same, nano structures comprising nano rods, nano agglomerations, nano recesses, nano patterns with nano line widths, nano through-holes or a combination thereof, formed on a light emitting surface of a light emitting device, thereby enhancing the light extraction efficiency of the device.

6 Claims, 14 Drawing Sheets

FIG. 16d

US 7,893,448 B2

LIGHT EMITTING DEVICE HAVING NANO STRUCTURES FOR LIGHT EXTRACTION

This application claims priority to Korean Application No. 10-2005-0043596 filed on May 24, 2005, which is incorporated by reference, as if fully set forth herein.

BACKGROUND

The present invention relates to a light emitting device having nano structures for light extraction and a method for manufacturing the same.

In general, a light emitting diode is one of light sources with a single wavelength, which has various applications such as light sources for cars, electronic display boards, lighting devices, and backlight units for display devices.

Light generated in a light emitting diode is mostly confined inside the diode due to total internal reflection with a critical angle at an interface between two media such as a semiconductor and air.

Figure 1:
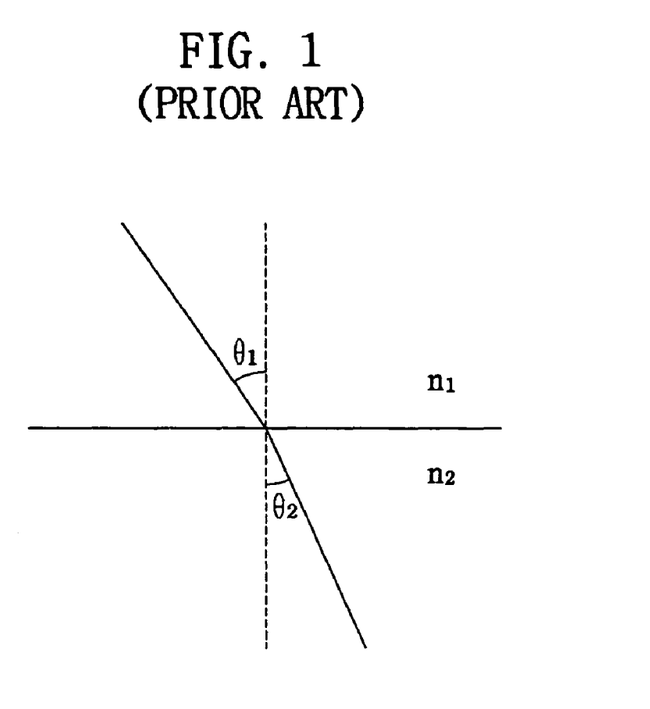
FIG. 1 is a conceptual diagram illustrating a light path between two media having different refraction indices.

FIG. 1 is a conceptual diagram illustrating a light path between two media having different refraction indices. When light travels from a first medium having a refraction index of '$n_1$' to a second medium having a refraction index of '$n_2$', the light travels per the Snell's law that is expressed by Equation 1. The light incident on the second medium from the first medium with an angle less than the critical angle passes through an interface in-between and light incident at an angle larger than the critical angle undergoes a total internal reflection.

$$n_i * \sin \theta_1 = n_2 * \sin \theta_2 \tag{1}$$

Where, $\theta_1$ is an incident angle and $\theta_2$ is a refraction angle.

Figure 2:
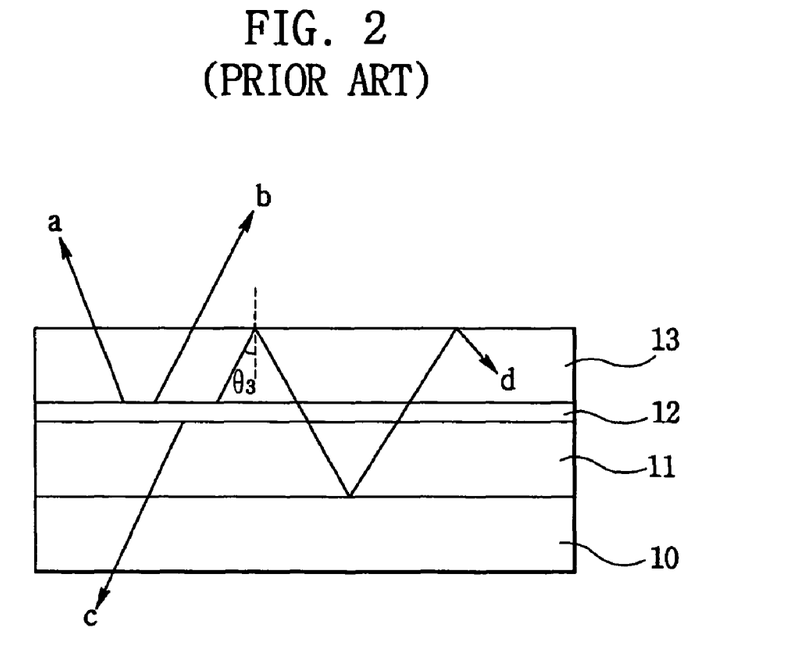
FIG. 2 is a schematic sectional view showing a light path in a typical light emitting diode.

FIG. 2 is a schematic sectional view showing a light path in a typical light emitting diode. In the structure of a light emitting diode in which an n-semiconductor layer (11), an active layer (12) and a p-semiconductor layer (13) are laminated in sequence on a substrate (10), light (a, b, c) traveling to the outside of the device at an angle less than a critical angle among light emitted from the active layer (12) passes through an interface.

However, light (d) traveling toward the outside of the device at an angle ($\theta_3$) larger than the critical angle is totally reflected and confined within the device.

Therefore, as the amount of light confined within the device increases, the light output of the light emitting diode decreases and the characteristics thereof are degraded.

There are various methods for improving light extraction efficiency in a light emitting diode.

First, there is a method for increasing a probability of vertical incidence of light in a light emitting diode chip by changing the shape of the chip. It is known that it is theoretically optimum for a light emitting diode chip to have a hemispherical shape. However, disadvantages are that it is difficult to fabricate a light emitting diode chip having the hemispherical shape and fabrication costs thereof increase.

A second method is for encapsulating a light emitting diode with a hemispherical epoxy dome. However, it is difficult to fabricate such a light emitting diode.

A third is a technique for replacing a substrate capable of resorbing light emitted from a light emitting diode with a total-internal reflection substrate.

There is a method of fabricating a light emitting diode with a micro cavity or a resonant cavity structure. In this method, a very fine control and re-productivity are required for the thickness or the like of constitutional layers upon fabrication of the structure. In this case, efficient extraction of light from a semiconductor to air involves a difficulty in which an emission wavelength of a light emitting diode should precisely conform to a cavity mode.

Furthermore, the emission wavelength of a light emitting diode is changed to cause a rapid reduction in light output, if temperature or an operating current increases.

On the other hand, in order to improve light extraction efficiency of a light emitting diode, there have been recently proposed surface texturing techniques in which the surface of a light emitting diode chip for emitting light generated from the inside thereof to the outside is artificially roughened or formed with a regularly repeated pattern.

The surface texturing techniques are technique for improving light extraction efficiency in a light emitting diode chip. The techniques can further improve the light extraction efficiency by being employed in combination with other existing techniques such as a chip shape modification technique, an epoxy encapsulation technique, and a substrate modification technique.

The surface texturing techniques currently employ a method for providing a texture on a surface by forming a pattern using a mask or the like and performing wet or dry etching.

In these techniques, each layer in the structure of a light emitting diode has a certain thickness to restrict the height of a surface texture. In addition, etching thickness needs to be precisely controlled and re-produced during the etching process.

A further problem is that a variety of processes such as formation of a pattern for etching are required.

SUMMARY

The present invention is conceived to solve the aforementioned problems in the prior art. It is an object of the present invention to provide a light emitting device having nano structures for light extraction, wherein the nano structures are formed on a light emitting surface of the light emitting device, thereby improving light extraction efficiency.

According to a first preferred aspect of the present invention for achieving the object, there is provided a light emitting device having nano structures for light extraction, comprising a light emitting structure in which a first layer with a first polarity, an active layer, and a second layer with a second polarity opposite to the first polarity are laminated, a plurality of nano structures formed each spaced apart from one another on the second layer, a first conductor formed beneath the first layer, and a second conductor formed on the second layer.

According to a second preferred aspect of the present invention for achieving the object, there is provided a light emitting device having nano structures for light extraction, comprising a light emitting structure including an active layer emitting light and a main light emitting surface through which the light emitted from the active layer mostly emerges to the outside in a specific direction, and a plurality of nano structures formed each spaced apart from one another on the main light emitting surface of the light emitting structure.

According to a third preferred aspect of the present invention for achieving the object, there is provided a light emitting device having nano structures for light extraction, comprising a substrate, a structure with an electron injection layer, an active layer and a hole injection layer laminated on the substrate, a plurality of nano rods spaced apart from one another in regions on a top surface of the hole injection layer except for mutually apart from first and second regions, a first electrode formed on the first region of the hole injection layer, and a second electrode formed on a floor surface of a recess in the second region, the recess formed by etching from the hole injection layer to a portion of the electron injection layer.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION

Hereinafter, preferred embodiments of the present invention will be described in detail with reference to the accompanying drawings.

Figure 3:
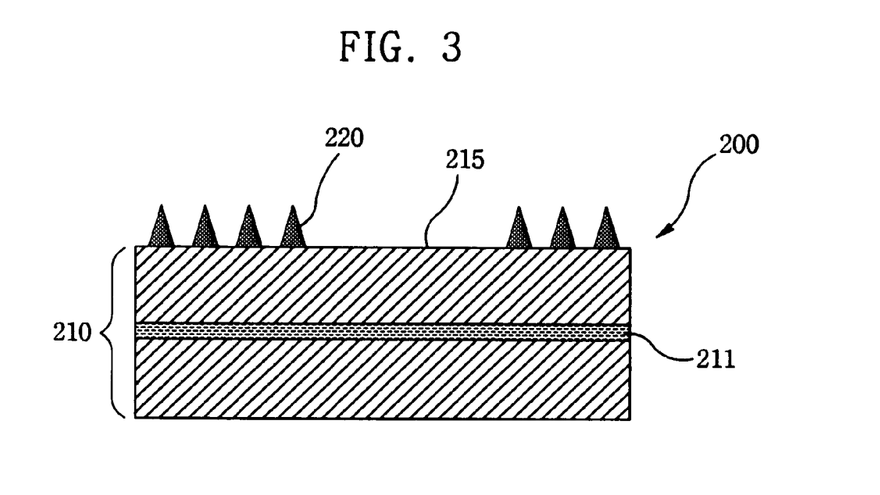
FIG. 3 is a sectional view showing the basic configuration of a light emitting device having nano structures for light extraction according to the present invention.

FIG. 3 is a sectional view showing the basic configuration of a light emitting device having nano structures for light extraction according to the present invention. The light emitting device (200) according to the fundamental sprit of the present invention comprises: a light emitting structure (210) including an active layer (211) capable of emitting light and a main light emitting surface (215) through which the light emitted from the active layer (211) mostly emerges to the outside in a certain direction; and a plurality of nano structures (220) each spaced apart on the light emitting surface (215) of the light emitting structure (210).

Here, the nano structures (220) respectively have a nano size and refer to nano rods shown in FIG. 3, nano agglomerations, nano recesses, nano patterns with nano line widths, nano through-holes, or a combination thereof.

In addition, the nano pattern is defined as being in the form of lines rather than dots.

Furthermore, at least one material layer is further laminated on the light emitting surface (215) of the light emitting structure (210). The nano through-hole is formed to penetrate through the material layer and is defined as a nano through-hole.

In addition, the main light emitting surface (215) is defined as a particular surface of the light emitting structure (210) through which most of the light is emitted.

In wit, if the light emitting structure (210) is a body with a plurality of surfaces, a surface through which a greatest amount of light is emitted among the plurality of surfaces becomes the main light emitting surface.

As shown in FIG. 3, for example, the light emitted from the active layer (211) of the light emitting structure (210) emerges through a bottom surface, lateral surfaces and a top surface of the light emitting structure (210). If a reflective plate or layer is formed on the bottom surface, most of the light emerges through the top surface.

In this case, the top surface becomes a main light emitting surface.

Therefore, in the present invention, a nano structure such as a nano rod formed on the main light emitting surface (215) prevents the occurrence of a phenomenon in which the light emitted from the light emitting device is subjected to total internal reflection and then confined within the device, thereby improving the light extraction efficiency of the light emitting device.

Meanwhile, the light emitting structure (210) is preferably a structure of a light emitting diode, and may be a structure of an equivalent light emitting device.

Figure 4A:
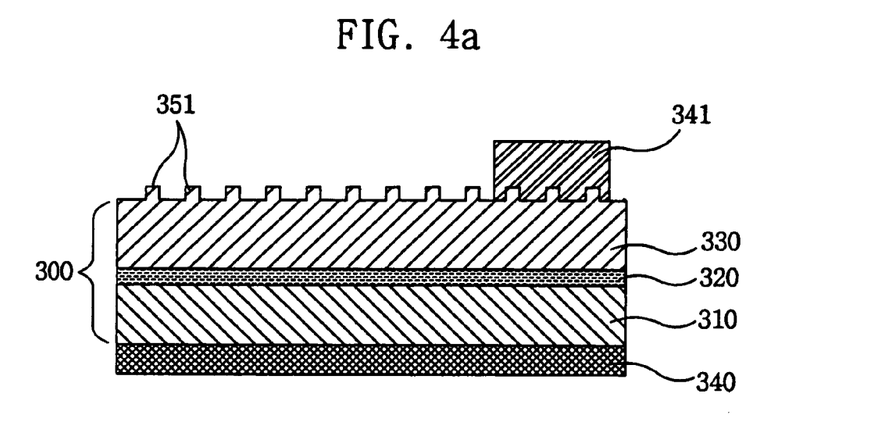
FIGS. 4a and 4b are sectional views of a light emitting device having nano structures for light extraction according to a first embodiment of the present invention.

FIGS. 4a and 4b are sectional views of a light emitting device having nano structures for light extraction according to a first embodiment of the present invention. First, the light emitting device of FIG. 4a comprises a light emitting structure (300) having a first layer (310) with a first polarity, an active layer (320), and a second layer (330) with a second polarity opposite to the first polarity, which are laminated. A plurality of nano rods (351) made of the material of the second layer (330) and spaced apart from one another are formed on the second layer (330). A first conductor (340) is formed beneath the first layer (310) and a second conductor (341) is formed on the second layer (330).

Here, the first conductor (340) is formed of a conductive material useable an electrode through which a current can smoothly flow, and is preferably formed thereunder with a metallic support layer.

The first polarity is n-type or p-type. For example, if the first polarity is n-type, the second polarity is p-type. Preferably, the first layer (310) and the second layer (330) are formed of a compound semiconductor such as 'GaN'.

It is preferred that the nano rods (351) be formed of the same material as the second layer, or formed of a current diffusive material.

Figure 4B:
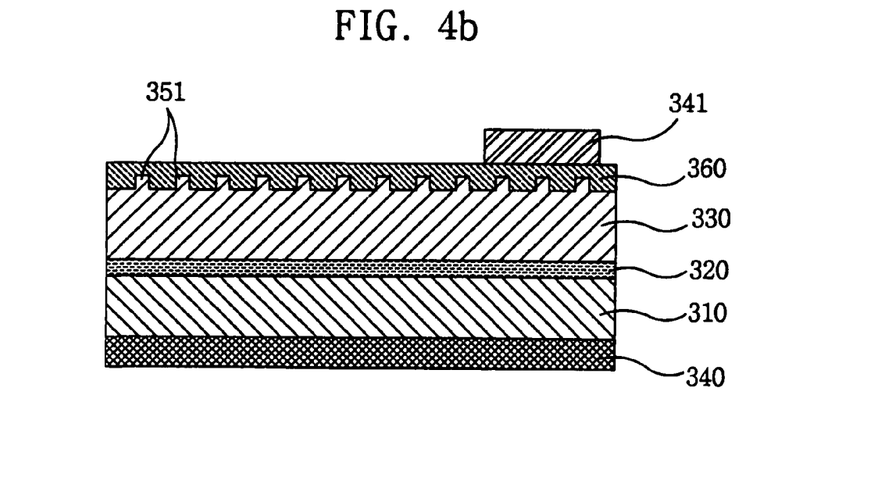

Furthermore, as compared with the structure of the light emitting device of FIG. 4a, the light emitting device of FIG.

4b further comprises: a current diffusion layer (360) that is formed on the second layer (330) while covering the plurality of nano rods (351) so as to transmit light and diffuse an electric current; and a second conductor (341) formed on the current diffusion layer (360).

Figure 5A:
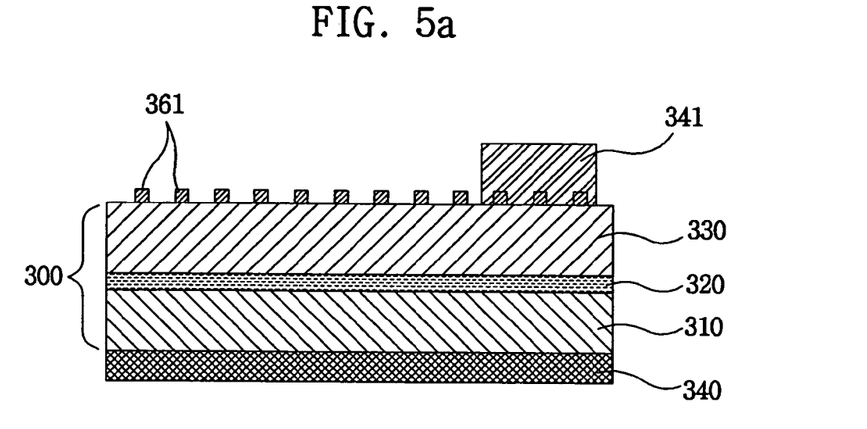
FIGS. 5a to 5c are sectional views of a light emitting device having nano structures for light extraction according to a second embodiment of the present invention.

FIGS. 5a to 5c are sectional views of a light emitting device having nano structures for light extraction according to a second embodiment of the present invention. The light emitting device of FIG. 5a comprises a plurality of nano agglomerations (361) that are formed to be spaced apart from one another on the second layer (330) of the light emitting structure (300).

That is, the agglomerations (361) are formed by means of a method for forming nano rods (explained later). The agglomerations (361) are disposed on the second layer (330) while each being extremely thin and can transmit light therethrough and be used for light extraction.

Figure 5B:
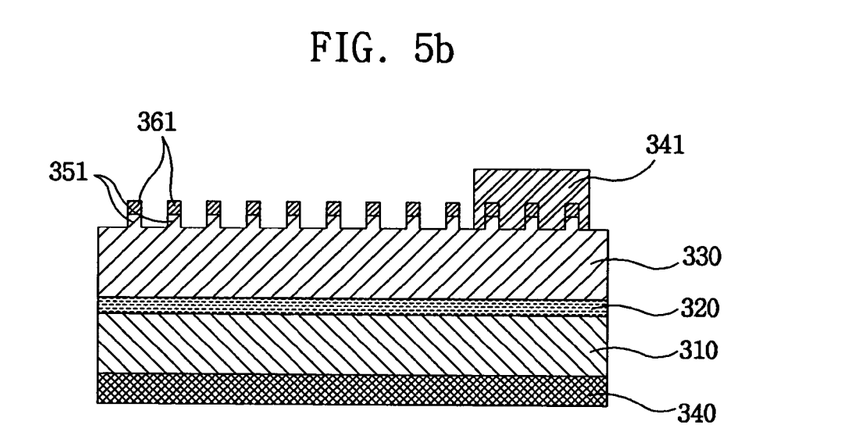

In addition, as compared with the structure of the light emitting device of FIG. 4a, the light emitting device of FIG. 5b further comprises agglomerations (361) that are formed on each of the plurality of nano rods (351) and made of a material different from that of the second layer (330). The agglomeration can transmit light therethrough.

Figure 5C:
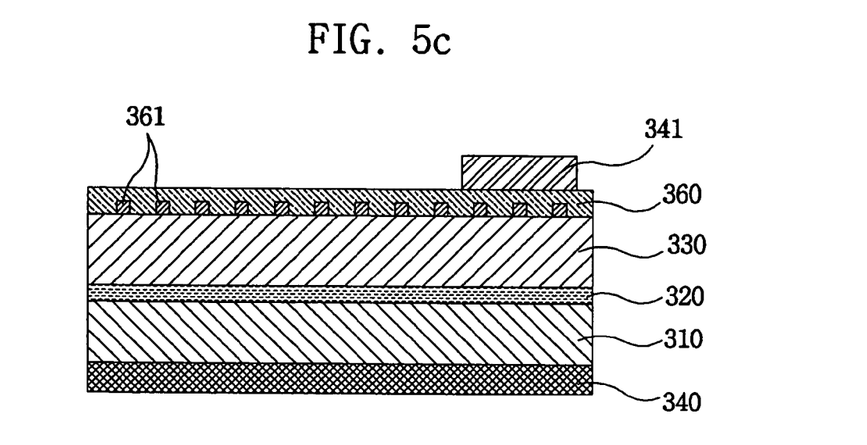

Furthermore, as compared with the structure of the light emitting device of FIG. 5a, the light emitting device of FIG. 5c further comprises a current diffusion layer (360) that is formed on the second layer (330) while covering the agglomerations (361) so as to transmit light and diffuse an electric current; and a second conductor (341) formed on the current diffusion layer (360).

Here, the agglomerations (361) are made of metal, and the current diffusion layer (360) is preferably formed of a transparent conductive oxide film such as ITO.

Figure 6A:
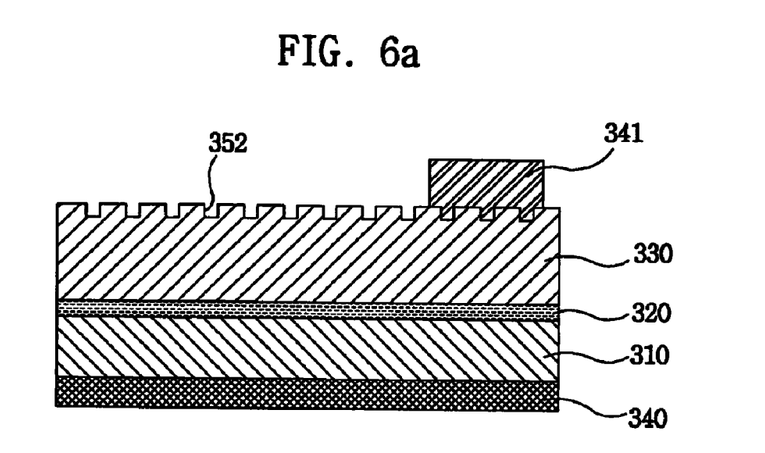
FIG. 6a to 6c are sectional views of a light emitting device having nano structures for light extraction according to a third embodiment of the present invention.
Figure 6B:
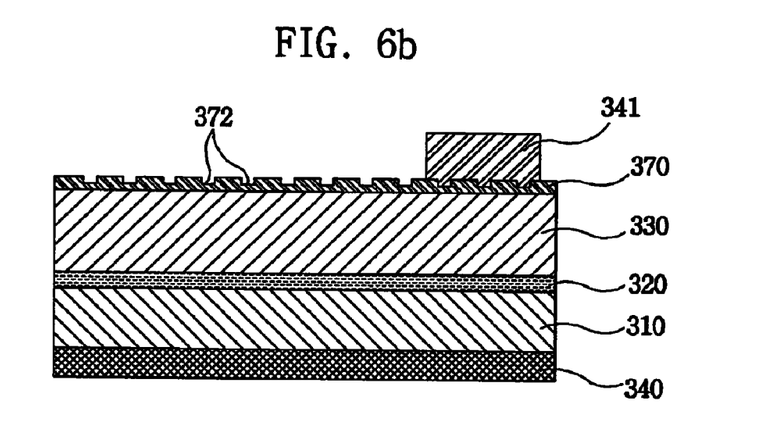
Figure 6C:
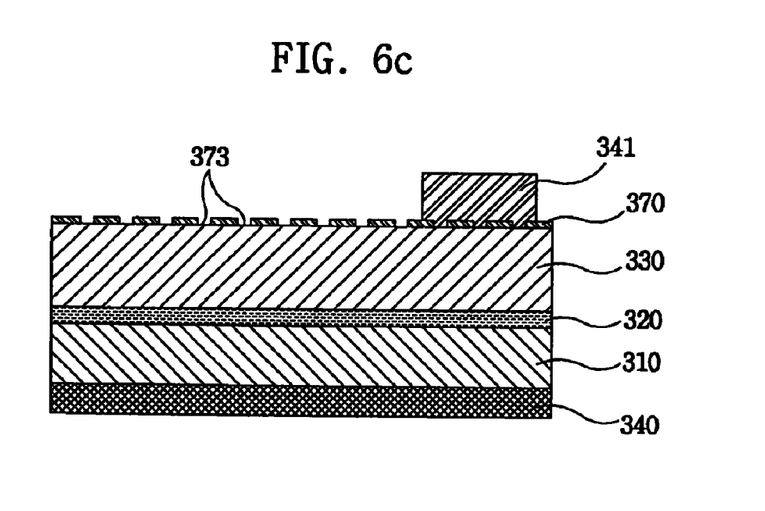

FIG. 6a to 6c are sectional views of a light emitting device having nano structures for light extraction according to a third embodiment of the present invention. The light emitting device of the third embodiment includes nano recesses or nano through-holes formed on the light emitting structure.

The light emitting device of FIG. 6a includes a plurality of nano recesses (352) each spaced apart on the second layer (330) of the light emitting structure (300).

The light emitting device of FIGS. 6b and 6c further includes a light-transmissive and conductive film (370) formed on the second layer (330) of the light emitting structure (300), and a plurality of nano recesses and nano through-holes formed in the light-transmissive and conductive film (370).

The light-transmissive and conductive film (370) is defined as a film through which light can be transmitted and which has conductivity to allow an electric current to flow therethrough. The light-transmissive and conductive film (370) may be a conductive film including a metallic layer and a semiconductor layer doped with impurities.

Figure 7:
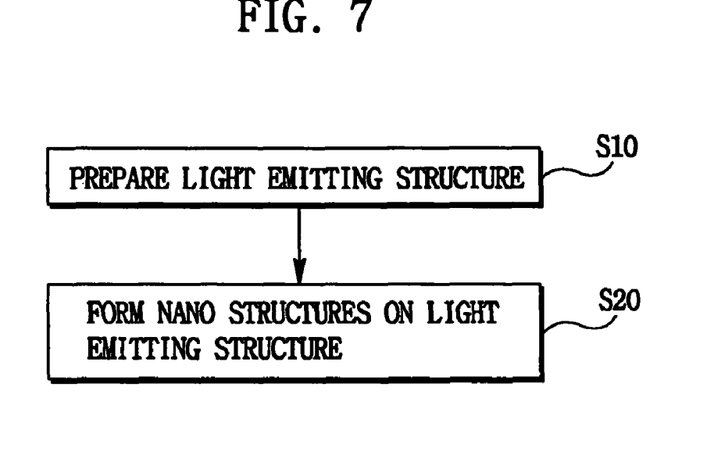
FIG. 7 is a flowchart illustrating a process for manufacturing a light emitting device having nano structures for light extraction according to the present invention.

FIG. 7 is a flowchart illustrating a process for manufacturing a light emitting device having nano structures for light extraction according to the present invention. First, a light emitting structure is prepared by laminating a first layer with a first polarity, an active layer and a second layer with a second polarity opposite to the first polarity (S10).

Then, a plurality of nano structures are formed on the second layer of the light emitting structure (S20).

Here, the plurality of nano structures include nano rods protruding from the top of the second layer, nano-sized agglomerations formed on the second layer, nano recesses formed on the second layer, nano patterns with a nano line width, or a combination thereof.

In addition, the nano patterns are defined as being in the form of lines rather than dots.

Therefore, the nano structures prevent light emitted from the light emitting structure from being subjected to total internal reflection, thereby increasing the amount of light emerging to the outside of the light emitting structure.

Figure 8A:
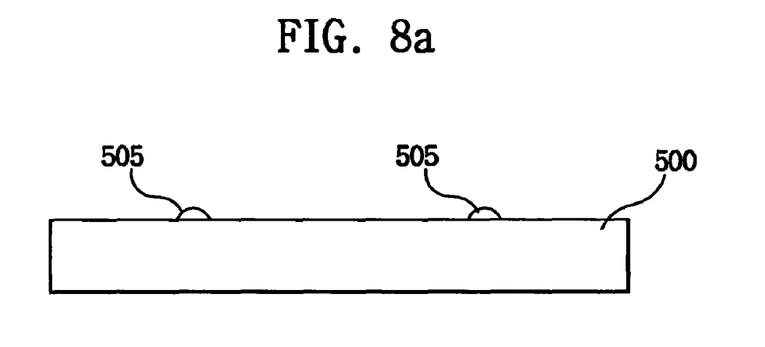
FIGS. 8a and 8b are schematic sectional views illustrating the concept of growth of nano-rods on a base layer according to the present invention.

FIGS. 8a and 8b are schematic sectional views illustrating the concept of growth of nano-rods on a base layer according to the present invention. When a compound semiconductor is grown on a base layer at a growth temperature of 500° C. within a temperature range of 200~900° C., a plurality of seeds (505) are formed in a dot pattern on the original base layer (500) as shown in FIG. 8a.

Here, the base layer refers to a layer such as the second layer of the light emitting device, which is used for formation of nano rods.

Figure 8B:
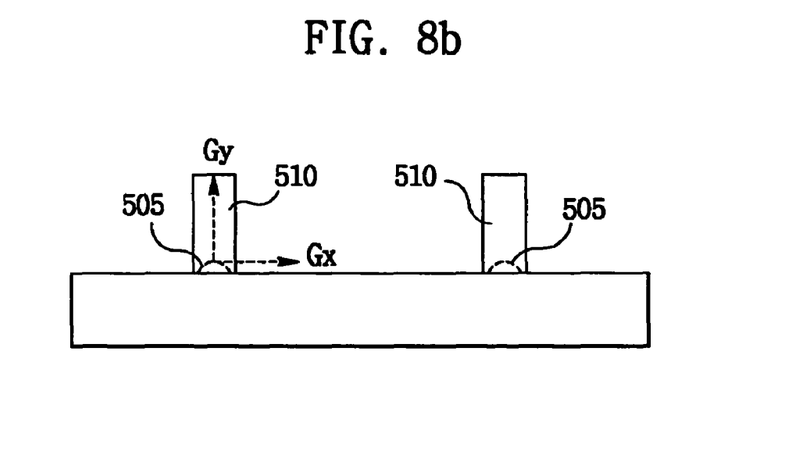

Thereafter, if a vertical growth component (Gy) is considerably dominant rather than a lateral growth component (Gx) in each of the seeds (505), the volume of the vertical growth becomes larger than that of the horizontal growth in each of the seeds (505). Eventually, a plurality of nano rods (510) are each spaced apart from one another.

Here, the growth temperature of 500° C. is a temperature relatively lower than the growth temperature of a compound semiconductor of GaN.

Figure 9A:
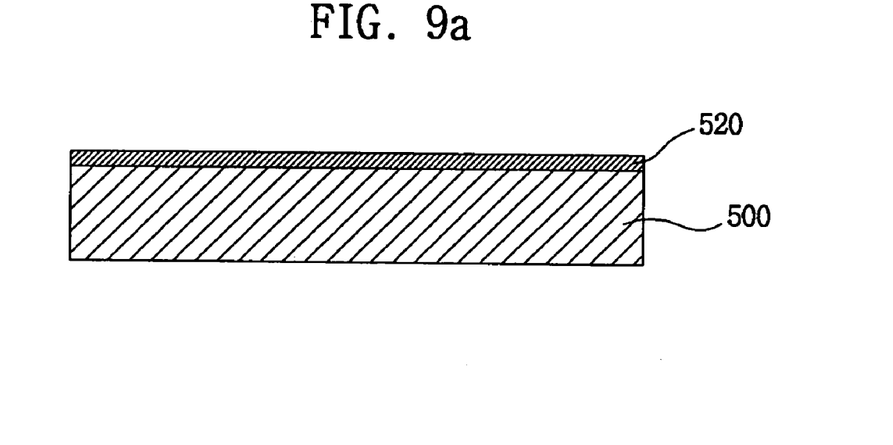
FIGS. 9a to 9c are schematic sectional views illustrating the other concept of growth of nano-rods on a base layer according to the present invention.

FIGS. 9a to 9c are schematic sectional views illustrating another concept of growth of nano rods on a base layer according to the present invention. As shown in FIG. 9a, a metallic thin film layer (520) is formed on a base layer (500).

Figure 9B:
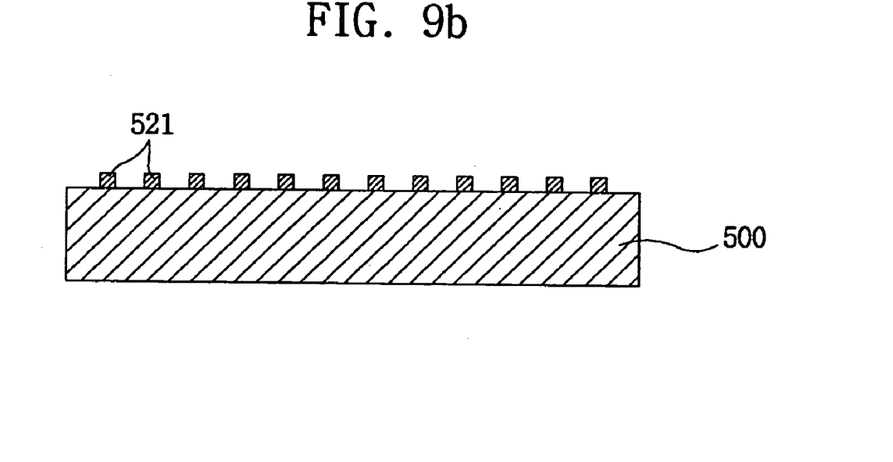

Then, the metallic thin film layer (520) is heat-treated to form a plurality of nano agglomerations (521) each spaced apart from one another (FIG. 9b).

That is, a structure similar to that of FIG. 5a can be formed.

Figure 9C:
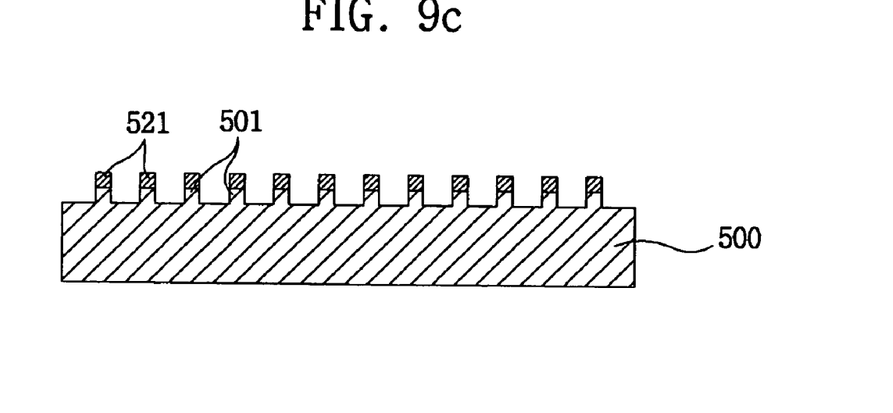

Thereafter, by using the plurality of nano agglomerations (521) as a mask, an upper portion of the base layer (500) is removed to form a plurality of nano rods (501) each spaced apart from one another on the base layer (500) (FIG. 9c).

Through the process of FIG. 9c, the plurality of nano rods (501) are formed on the base layer (500).

More specifically, a laminated structure of nano rods and metallic nano rods can be similarly formed as that of FIG. 5b.

After the process of FIG. 9c, the plurality of nano-sized agglomerations (521) are removed, thereby forming nano rods out of the material of the base layer (500).

That is, it is possible to form a nano rod structure similar to that of FIG. 4a.

Figure 10A:
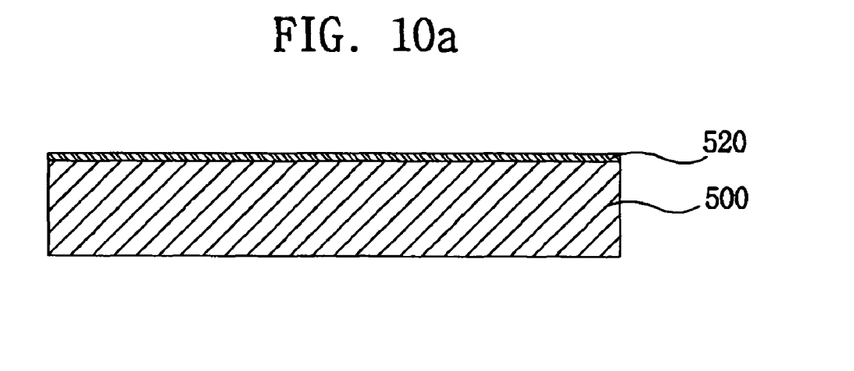
FIGS. 10a to 10c are schematic sectional views illustrating the concept of formation of nano recesses on a base layer according to the present invention.

FIGS. 10a to 10c are schematic sectional views illustrating the concept of formation of nano recesses on a base layer according to the present invention. First, a metallic thin film layer (520) is formed on the base layer (500) (FIG. 10a).

Figure 10B:
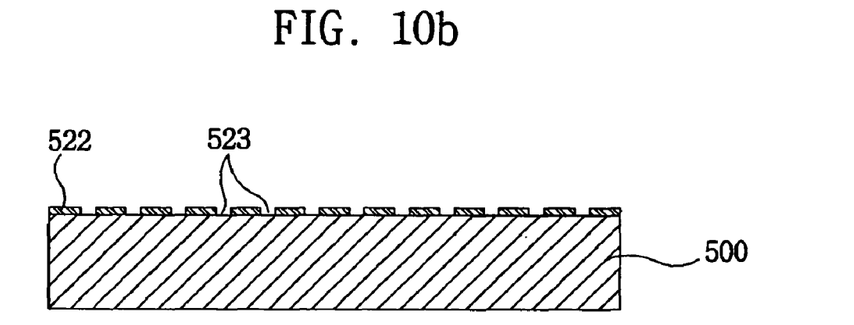

Then, the metallic thin film layer (520) is heat-treated to form continuous agglomerations (522), and a plurality of through-holes (523) are formed each spaced apart from one another while alternating with apart from agglomerations (522) (FIG. 10b).

Through the process of FIG. 10b, it is possible to form a structure similar to that of FIG. 6c.

At this time, since the metallic thin film layer (520) is thin enough to allow light to be transmitted therethrough, the formed agglomerations (522) allow light to be transmitted therethrough and thus perform the function of the light transmissive and conductive film of FIG. 6c.

Figure 10C:
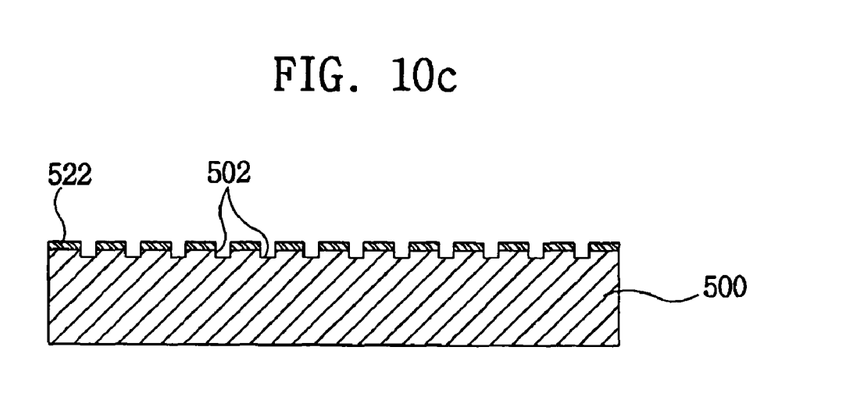

Thereafter, by using the plurality of nano agglomerations (521) as a mask, upper portions of the base layer (500) exposed through the nano through-holes (523) are removed to form a plurality of nano recesses (502) each spaced apart from one another on the base layer (500) (FIG. 10c).

After the process of FIG. 10c, the plurality of nano agglomerations (521) are removed, thereby forming the nano recesses (502) on the base layer (500).

Therefore, it is possible to form a structure similar to that of FIG. 6a.

Figure 11A:
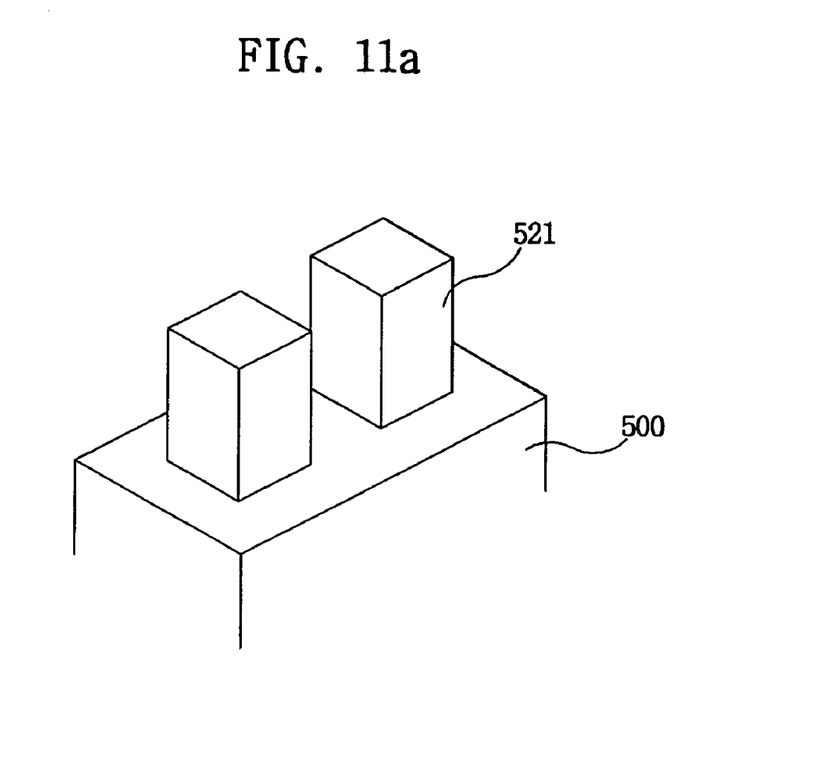
FIGS. 11a and 11b are perspective views schematically showing states where nano rods and nano recesses are formed according to the present invention, respectively.
Figure 11B:
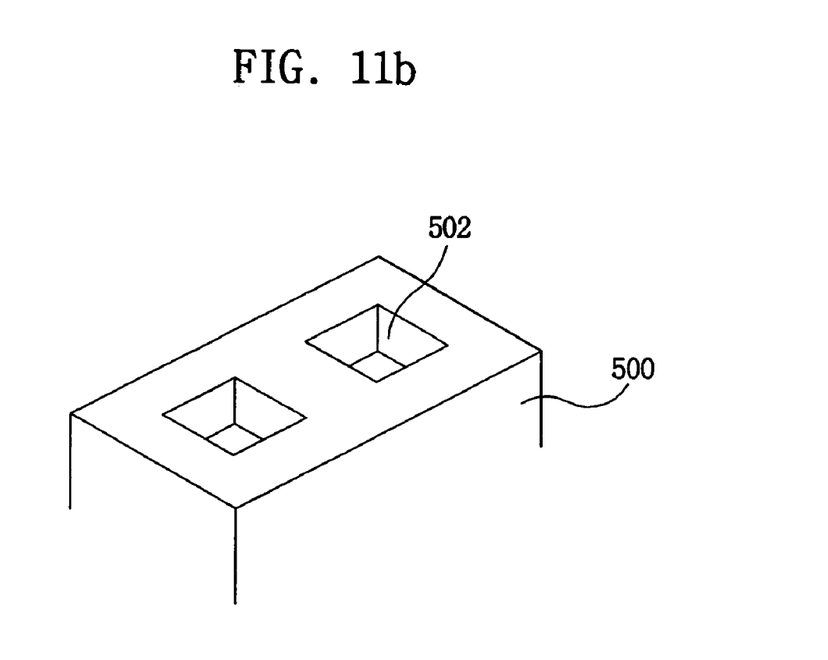

FIGS. 11a and 11b are perspective views schematically showing states where nano rods and nano recesses are formed according to the present invention, respectively. The nano rods (521) protrude in nano size from the top of the base layer (500) as shown in FIG. 11a. The nano recesses (502) are formed literally in nano size on the base layer (500) as shown in FIG. 11b.

Figure 12A:
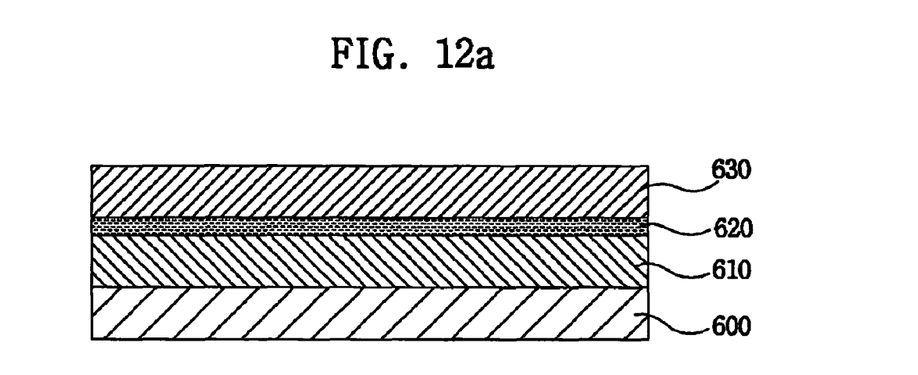
FIGS. 12a to 12g are sectional views illustrating a process of manufacturing an example of a light emitting device having nano rods for light extraction according to the present invention.

FIGS. 12a to 12g are sectional views illustrating a process of manufacturing an example of a light emitting device having nano rods for light extraction according to the present invention. An electron injection layer (610), an active layer (620) and a hole injection layer (630) are formed on a substrate (600) (FIG. 12a).

Here, the electron injection layer (610) and the hole injection layer (630) are formed of an n-type semiconductor material and a p-type semiconductor material based on any one of Si, GaAs, SiC, GaN and ZnO.

In addition, the active layer (620) is formed of a semiconductor material based on Si, GaAs, SiC, GaN or ZnO.

Figure 12B:
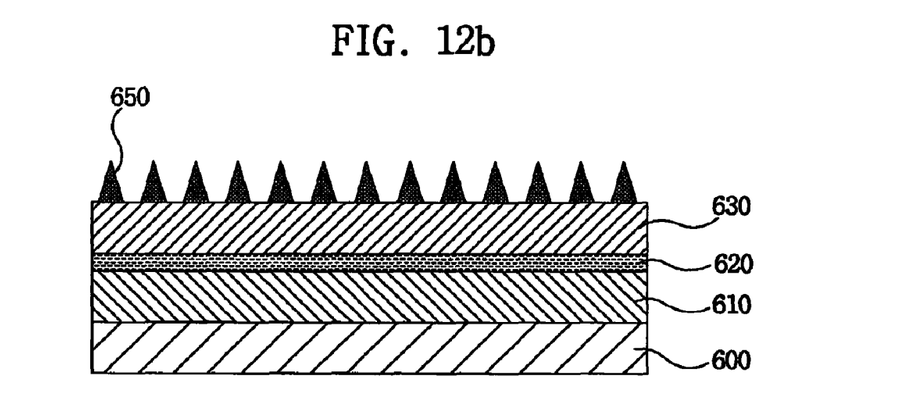

Thereafter, a plurality of nano rods (650) are formed each spaced apart from one another on the hole injection layer (630) (FIG. 12b).

Preferably, the growth temperature of the nano rods (650) is in the range of 200~900° C. It is more preferred that the growth temperature of the nano rods (650) be lower than that of the hole injection layer (630).

Preferably, the nano rods (650) are formed of a material consisting of a group of Si, GaAs, SiC, GaN or ZnO.

The nano rods are formed of a single crystalline material or a polycrystalline material.

Figure 12C:
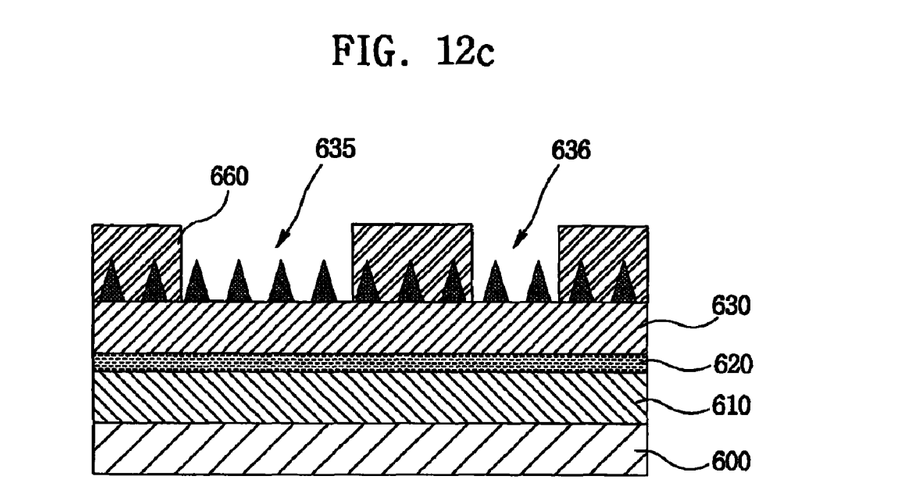

Then, a first mask layer (660) is formed in regions on a top surface of the hole injection layer (630), except for a first region (635) and a second region (636) that correspond to portions of the entire top surface of the hole injection layer (630) including the plurality of nano rods (650) each being spaced apart from each other (FIG. 12c).

Figure 12D:
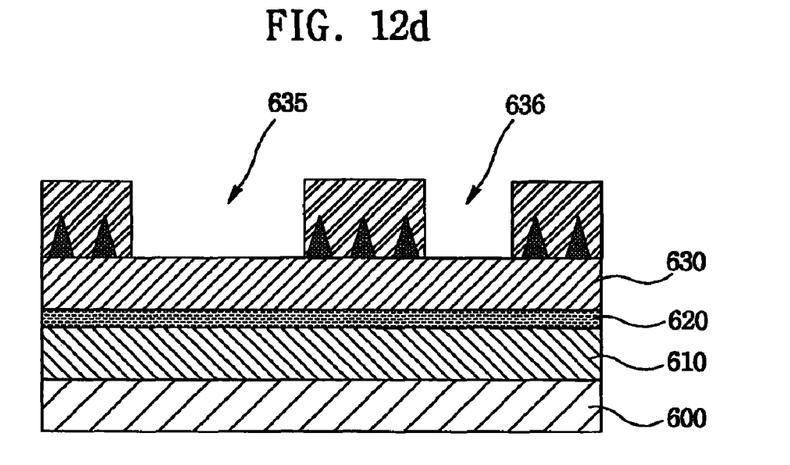

Thereafter, the nano rods (650) disposed in the first and second regions (635, 636) are removed (FIG. 12d).

Figure 12E:
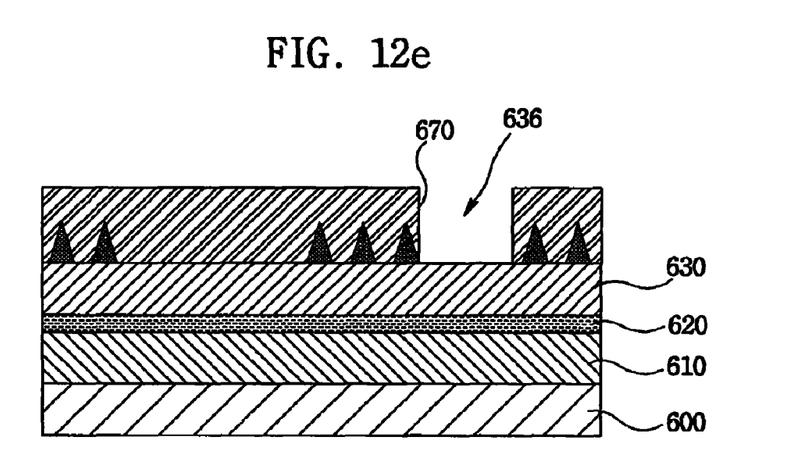

Then, a second mask layer (670) is formed on the entire top surface of the hole injection layer (630), except for the second region (636) (FIG. 12e).

Figure 12F:
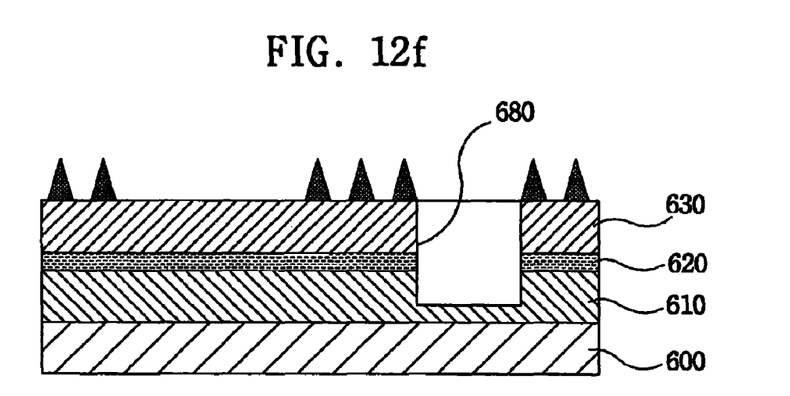

Subsequently, masking is performed using the second mask layer (670) and a recess (680) is formed by carrying out etching from the hole injection layer (630) in the second region (636) to a portion of the electron injection layer (610). Then, the second mask layer (670) is removed (FIG. 12f).

Figure 12G:
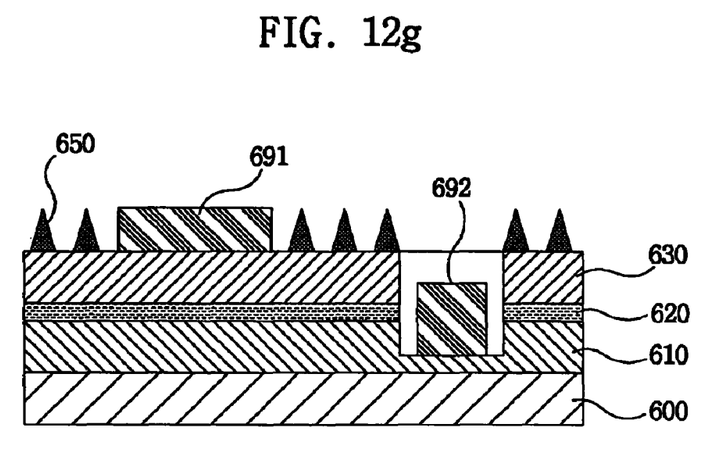

Finally, a first electrode (691) is formed in the first region, and a second electrode (692) is formed on a floor surface of the recess (680) in the electron injection layer (610) (FIG. 12g).

The first and second electrodes (691, 692) are formed of a metallic material or a conductive oxide film-based material.

This method enables a spontaneous growth of nano rods on the surface of a light emitting device through a wet or dry etching process without performing a conventional surface texturing process, thereby improving the light output of the light emitting device.

Now, a light emitting device having nano rods for light extraction, fabricated by processes of FIGS. 12a to 12g comprises a substrate (600), a structure with an electron injection layer (610), an active layer (620) and a hole injection layer (630) laminated on the substrate (600), a plurality of nano rods (650) spaced apart from one another in regions on a top surface of the hole injection layer (630) except for mutually apart from first and second regions (635,636), a first electrode (691) formed on the first region (635) of the hole injection layer (630), and a second electrode (692) formed on a floor surface of a recess formed in the electron injection layer (610) in the second region (636), the recess formed by etching from the hole injection layer (630) to a portion of the electron injection layer (610).

At this time, the nano rods (650) are preferably formed of the same material as that of the hole injection layer (630), or a current diffusive material.

Furthermore, a current diffusion layer is further formed on the hole injection layer (630) while covering around the nano rods (650), and the first electrode (691) is formed on the current diffusion layer, where the current diffusion layer comprises a transparent conductive oxide film.

Here, the current diffusion layer comprises a transparent conduction oxide film.

Figure 13:
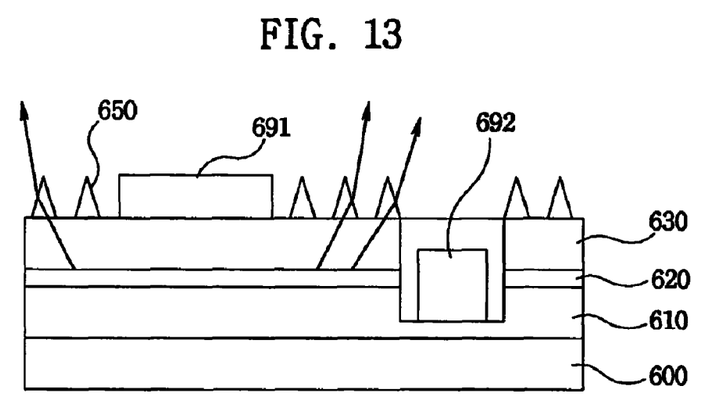
FIG. 13 is a schematic sectional view illustrating a light traveling path from a light emitting device having nano rods according to the present invention.

FIG. 13 is a schematic sectional view illustrating a light traveling path from a light emitting device having nano rods according to the present invention. Due to the plurality of nano rods (650) formed on the hole injection layer (630), the light emitted from the active layer (620) emerges to the outside of the device without being subjected to total internal reflection on the top of the hole injection layer (630).

Thus, the reduction in the amount of light subjected to total internal reflection can improve the light output of the device.

Figure 14:
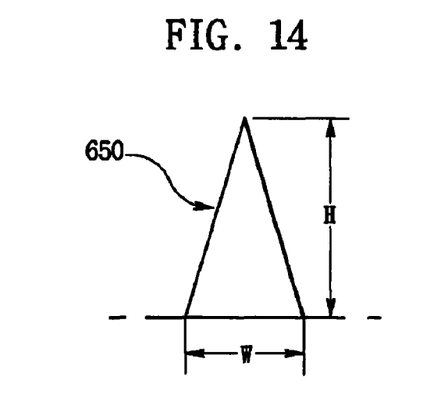
FIG. 14 is a conceptual view illustrating the height and width of a nano rod employed in the present invention.

FIG. 14 is a conceptual view illustrating the height and width of a nano rod employed in the present invention. The height (H) of the nano rod formed on a light emitting surface of a light emitting device is in the range of 2~50,000 nm, more preferably in the range of 10~1,000 nm.

The width (W) of the nano rod is in the range of 2~5,000 nm.

Figure 15A:
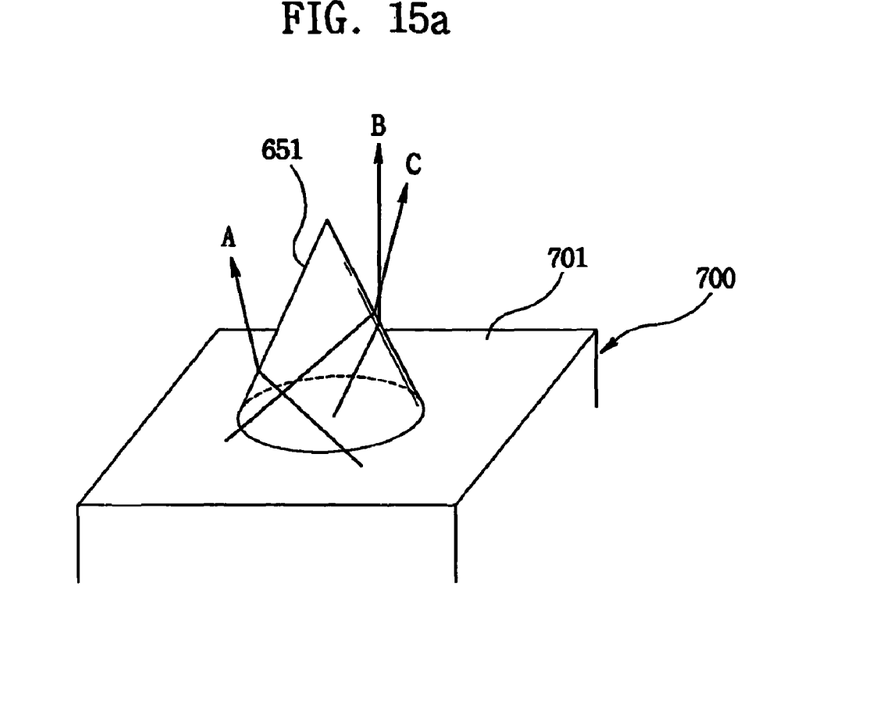
FIGS. 15a and 15b are perspective views showing light emission according to the shape of a nano rod in the present invention.
Figure 15B:
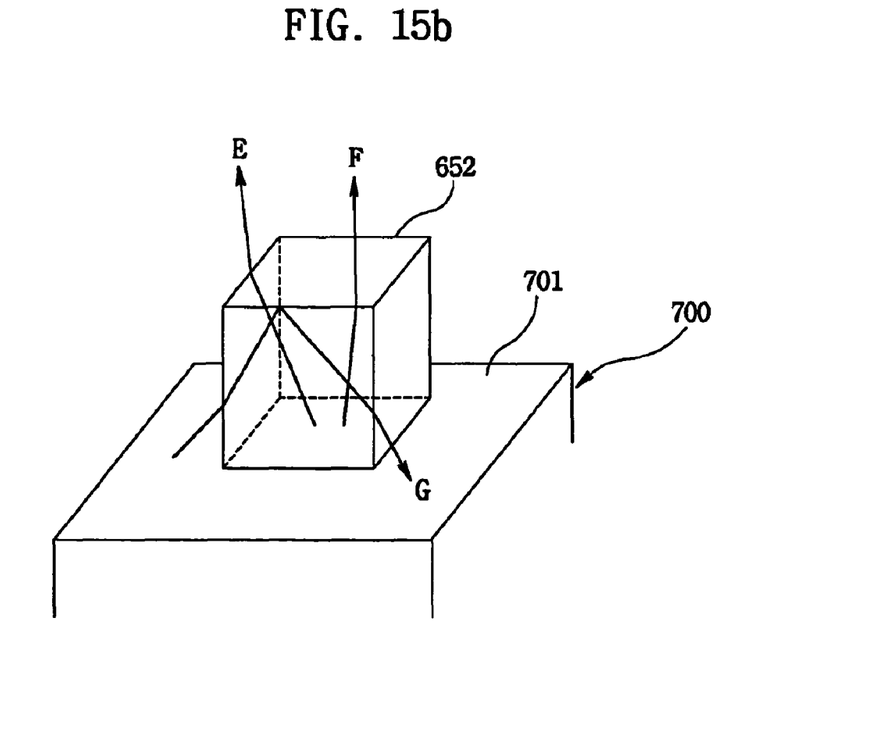

FIGS. 15a and 15b are perspective views showing light emission according to the shape of a nano rod in the present invention. A light emitting surface (701) of a light emitting device (700) is formed with a conical nano rod (651) as shown in FIG. 15a, or a square pillar-like nano rod (652) as shown in FIG. 15b.

Here, the conical nano rod (651) further improves the light output as compared against that of the square pillar-like nano rod (652).

As the conical nano rod (651) has a slant surface, light (A, B, C) incident on the slant surface is not subjected to total internal reflection but emerges to the outside.

On the contrary, since the square pillar-like nano rod (652) has a flat top surface, there is a probability that light may be subjected to total internal reflection. Some light ('G' in FIG. 15b) is subjected to total internal reflection and other light (E, F) emerges to the outside.

Figure 16A:
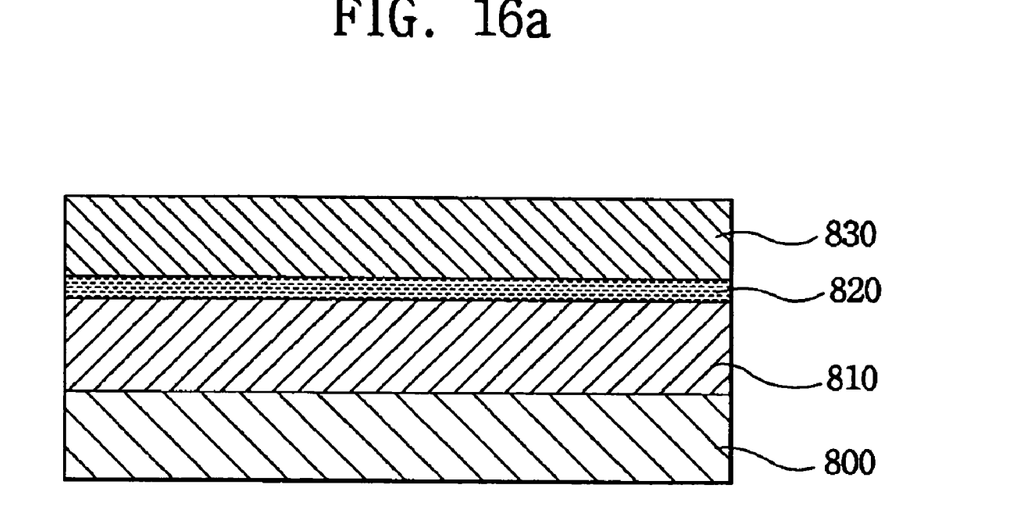
FIGS. 16a to 16d are sectional views illustrating a method for manufacturing a light emitting device having nano structures for light extraction, using an insulation substrate according to the present invention.

FIGS. 16a to 16d are sectional views illustrating a method for manufacturing a light emitting device having nano structures for light extraction, using an insulation substrate according to the present invention. A first semiconductor layer (810), an active layer (820), and a second semiconductor layer (830) are formed on an insulation substrate (800) (FIG. 16a).

The insulation substrate (800) has an insulation property, like a sapphire substrate.

The first semiconductor layer (810) is an n-type semiconductor layer or a p-type semiconductor layer. If the first semiconductor layer (810) is an n-type semiconductor layer, the second semiconductor layer (830) is a p-type semiconductor layer.

Figure 16B:
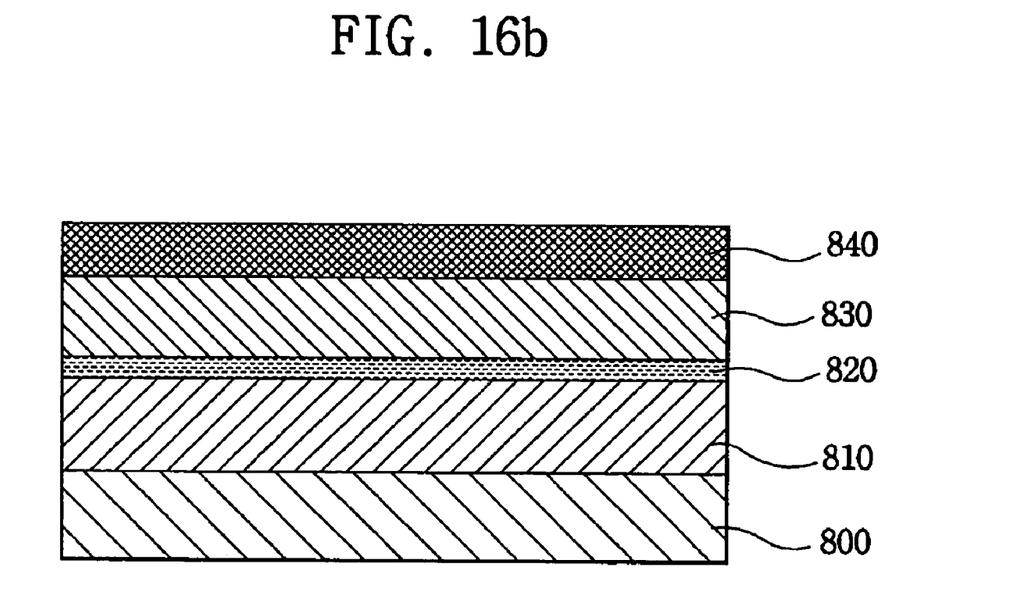

Successively, a metallic support (840) is formed on the second semiconductor layer (830) (FIG. 16*b*).

Here, the metallic support (840) is a metallic film formed by depositing a metal on the second semiconductor layer (830), or a pre-fabricated metallic structure bonded to the second semiconductor layer (830).

Figure 16C:
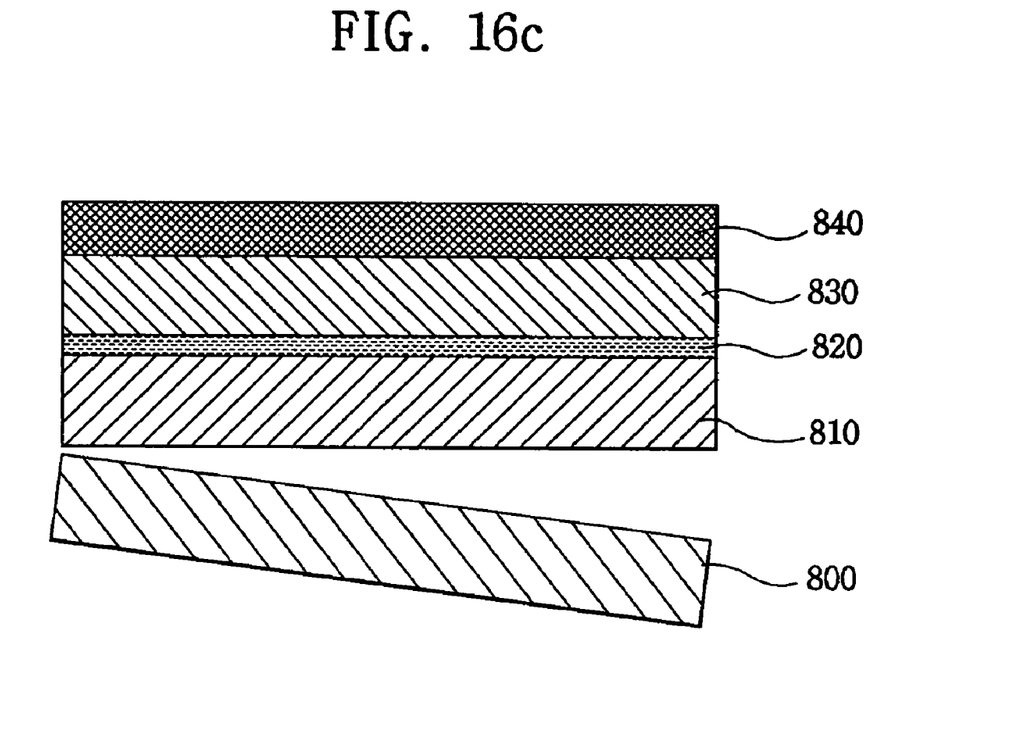

Subsequently, the insulation substrate (800) is separated from the first semiconductor layer (810) (FIG. 16*c*).

The separation of the insulation substrate (800) is preferably performed through a laser lift-off process.

Figure 16D:
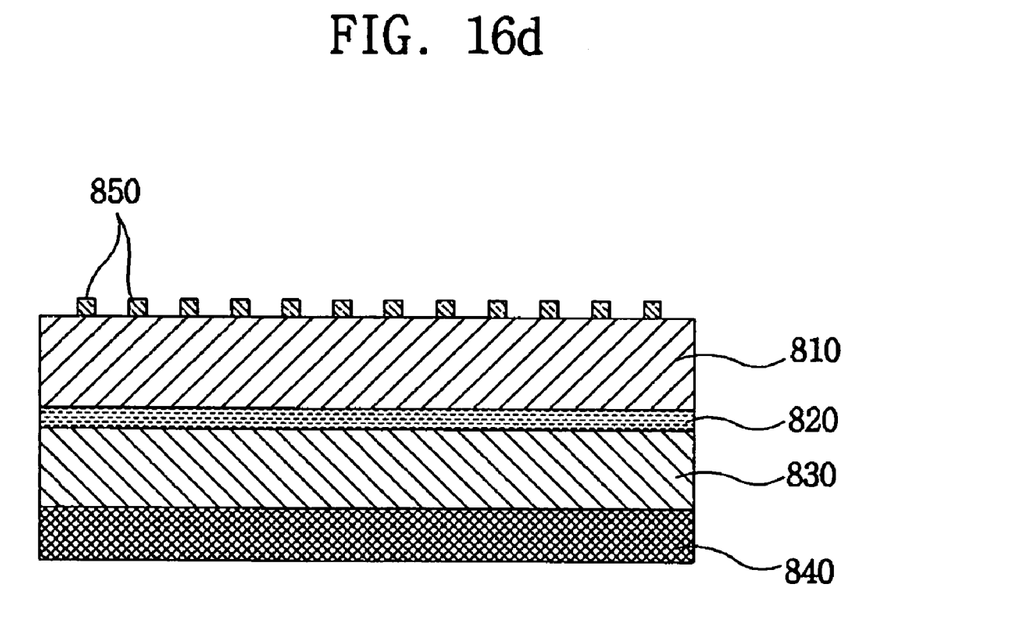

Thereafter, nano structures (850) are formed each spaced apart from one another on the first semiconductor layer (810) from which the insulation substrate (800) is separated (FIG. 16*d*).

In the process of FIG. 16*d*, any one of nano rods, nano agglomerations, and nano recesses is formed on the first semiconductor layer (810), as described above.

By this, a light emitting device may be manufactured through the processes of FIGS. 16*a* to 16*d* in accordance with the present invention.

However, a process to be performed after that of FIG. 16*d* is optional.

In other words, following the processes of FIGS. 16*a* to 16*d*, an optional process may be carried out of forming another electrode on the first semiconductor layer (810) while using the metallic support (840). It is also optional to perform other processes.

As described above, the present invention has an advantage in that nano structures are formed on a light emitting surface of a light emitting device to enhance the light extraction efficiency of the light emitting device.

Although the present invention has been described in connection with the specific embodiments, it is not limited thereto. It will be readily apparent to those skilled in the art that various modifications and changes can be made thereto without departing from the spirit and scope of the present invention defined by the appended claims. It will be also apparent that such modifications and changes fall within the scope of the present invention defined by the claims.

What is claimed is:

1. A light emitting device having nano structures for light extraction, comprising:
    a light emitting structure in which a first semiconductor layer with a first polarity, an active layer, and a second semiconductor layer with a second polarity opposite to the first polarity are laminated;
    a plurality of nano-sized structures on the second semiconductor layer;
    a first conductor on the first semiconductor layer; and
    a second conductor on the second semiconductor layer, wherein the plurality of nano-sized structures comprise nano-sized rods formed of the same or substantially the same material as that of the second semiconductor layer and agglomerations formed on the nano-sized rods, wherein the agglomerations are made of metal that transmit light therethrough from the light emitting structure and are used for light extraction.

2. The light emitting device as claimed in claim 1, wherein the first polarity is n-type or p-type.

3. The light emitting device as claimed in claim 1, wherein each of the nano sized structures has a height (H) of 2~50,000 nm and a width of 2~5,000 nm.

4. The light emitting device as claimed in claim 1, wherein the second conductor is further disposed thereon with a support layer.

5. The light emitting device as claimed in claim 1, wherein the first and second semiconductor layers comprise a compound semiconductor.

6. A light emitting device having nano structures for light extraction, comprising:
    a light emitting structure including a first semiconductor layer with a first polarity, a second semiconductor layer with a second polarity, an active layer emitting light and a main light emitting surface emitting the light from the active layer to the outside; and
    a plurality of nano-sized structures on the main light emitting surface, the plurality of nano-sized structures comprising nano-sized rods formed of the same or substantially the same material as that of the second semiconductor layer and agglomerations formed on the nano-sized rods, wherein the agglomerations are made of metal that transmit light therethrough from the light emitting structure and are used for light extraction.

* * * * *